United States Patent
Yamada et al.

(10) Patent No.: US 8,197,599 B2
(45) Date of Patent: Jun. 12, 2012

(54) GAS HEAD AND THIN-FILM MANUFACTURING APPARATUS

(75) Inventors: Takakazu Yamada, Susono (JP); Nobuyuki Kato, Susono (JP); Masaki Uematsu, Susono (JP)

(73) Assignee: Ulvac, Inc., Kanagawa (JP)

( * ) Notice: Subject to any disclaimer, the term of this patent is extended or adjusted under 35 U.S.C. 154(b) by 957 days.

(21) Appl. No.: 12/086,032

(22) PCT Filed: Nov. 13, 2006

(86) PCT No.: PCT/JP2006/322539
§ 371 (c)(1),
(2), (4) Date: Jun. 4, 2008

(87) PCT Pub. No.: WO2007/066472
PCT Pub. Date: Jun. 14, 2007

(65) Prior Publication Data
US 2009/0250004 A1    Oct. 8, 2009

(30) Foreign Application Priority Data
Dec. 6, 2005 (JP) ................................. 2005-351547

(51) Int. Cl.
*C23C 16/00* (2006.01)
(52) U.S. Cl. ............... 118/715; 156/345.33; 156/345.34
(58) Field of Classification Search ............... 118/715; 156/345.33, 345.34
See application file for complete search history.

(56) References Cited

U.S. PATENT DOCUMENTS

| | | | |
|---|---|---|---|
| 5,744,049 A | 4/1998 | Hills et al. | |
| 5,976,992 A * | 11/1999 | Ui et al. | 438/788 |
| 6,125,788 A | 10/2000 | Hills et al. | |
| 6,800,139 B1 * | 10/2004 | Shinriki et al. | 118/715 |

FOREIGN PATENT DOCUMENTS

| | | |
|---|---|---|
| EP | 0 693 769 A2 | 1/1996 |
| JP | 7-078774 | 3/1995 |
| JP | 9-246192 | 9/1997 |
| JP | 11-54459 | 2/1999 |
| JP | 2004-35971 | 2/2004 |

* cited by examiner

*Primary Examiner* — Ram Kackar
*Assistant Examiner* — Satish Chandra
(74) *Attorney, Agent, or Firm* — Carothers and Carothers

(57) ABSTRACT

A gas head that, at low cost, is capable of suppressing any deactivation of radical gas and capable of uniformly introducing a raw material gas on a substrate; and a relevant thin-film manufacturing apparatus are provided. A gas head (13) according to the present invention includes a reactive gas introduction port (30A) for introduction of a reactive gas, a plurality of raw material gas introduction ports (30B) for introduction of a raw material gas, and a dispersion board (32) for dispersing the raw material gas, wherein the plurality of the raw material gas introduction ports (30B) are disposed so as to surround the periphery of the reactive gas introduction port (30A). The reactive gas having been introduced in the reactive gas introduction port (30A) is mixed with the raw material gas having been introduced through a plurality of raw material gas introduction ports (30B) and dispersed by means of the dispersion board (32). Although the plurality of raw material gas introduction ports (30B) are disposed around the reactive gas introduction port (30A), they are not required to be minute holes such as shower holes.

10 Claims, 9 Drawing Sheets specific resistance distribution in substrate
L=30mm specific resistance distribution in substrate
L=50mm

GAS HEAD AND THIN-FILM MANUFACTURING APPARATUS

TECHNICAL FIELD

The present invention relates to a gas head used for an MOCVD apparatus, for example, for introducing film-forming gases such as a raw material gas, a reactive gas, and an inert gas into a reactive chamber, and to a thin-film manufacturing apparatus including the gas head.

BACKGROUND ART

Up to now, there have been proposed various techniques, such as that for uniformly mixing a raw material gas and a reactive gas and that for uniformly injecting gases onto a wafer, as means for improving the in-plane uniformity in the distribution of, for instance, thickness, quality, and composition or the like of a film in a wafer when a thin-film is produced by a CVD method, for instance, an MOCVD (Metal Organic Chemical Vapor Deposition) method.

For example, Patent Document 1 discloses a thin-film manufacturing apparatus for producing a thin-film by an MOCVD method, in which film formation is performed by introducing a gas mixture composed of a vaporized raw material gas and a reactive gas into a film-forming chamber with a vacuum atmosphere, and inducing a vapor phase chemical reaction on a substrate to be treated, such as a wafer, which is placed on a stage disposed within the film-forming chamber. The thin-film manufacturing apparatus is configured such that a shower head opposed to the stage is arranged on the upper portion of the film-forming chamber to enable the gas mixture to be uniformly sprayed onto the substrate through the shower head.

FIG. 10 shows a configuration example of a shower head 1. The shower head 1 is composed of a metal head body 2 provided with a introduction pipe 2a through which a gas mixture composed of a raw material gas and a reactive gas is introduced, and a metal shower plate 3 which covers an opening portion of the head body 2. The shower plate 3 is provided with a plurality of minute shower holes 3a through which the gas mixture passes. A space 4 for distributing the introduced gas mixture across the entire region in which the shower holes 3a are formed is provided between the head body 2 and the shower plate 3.
Patent Document 1: JP 2004-35971 A
Patent Document 2: JP 11-54459 A

DISCLOSURE OF THE INVENTION

Problems to be Solved by the Invention

The shower head 1 is excellent at uniformly supplying the gases on a surface of the substrate, and is widely used in a CVD process. Although there are various shower holes 3a for different purposes, an opening diameter thereof is generally around 1 mm, and the number of the shower holes 3a ranges from several hundred to several thousand. Therefore, production costs of the shower head is extremely expensive.

In addition, since the shower holes 3a are channels through which the raw material gas and the reactive gas flow, a film is easily adhered to the shower holes 3a, whereby periodic maintenance is required. However, it is difficult to remove the film adhered to the inside of the minute shower holes 3a, and residual films may cause generation of particles. Therefore, it is necessary to periodically replace the shower plate because reusing the shower plate is nearly impossible. As a result, production costs for semiconductors increase, which is problematic.

Further, in the thin-film manufacturing apparatus using the shower head 1, if there is a part where the conductance is small, such as shower holes 3a, it becomes difficult to discharge a gas from a primary side (inside the space 4 or introduction tube 2a) to a secondary side (film-forming chamber side). As a result, there is a problem in that discharging time (processing time) required to process a single substrate is prolonged, and productivity is thus reduced.

Particularly, in recent years, studies on ALD (Atomic Layer Deposition) film-formation as disclosed in Patent Document 2 above have been developed vigorously. ALD is a technique in which introduction/discharge of gases is repeated for several tens of cycles. Thus, the effect provided by reducing the gas discharging time per one cycle becomes larger in proportion to the number of cycles. Therefore, a rapid discharge of the gases will greatly contribute to an improvement of productivity.

Meanwhile, there are several methods other than that using the shower head, for introducing gases into the film-forming chamber, an example of which is a gas ring nozzle. However, in the gas ring nozzle, the ejection speed of a gas is higher in holes closer to a gas introduction port leading to a ring (a linear gas piping leading to a ring). As a result, the supply of the gas from the holes on a side closer to the gas introduction port becomes larger. This adversely affects the film performance such as film thickness distribution and composition distribution. Especially in the CVD process, the gas flow strongly affects the films. Thus, the above-mentioned shower head is employed in mass production apparatuses.

Further, in order to ensure reliability of the device and reduce degradation during processes, lowering of the film-forming temperature is strongly desired. To lower the film-forming temperature, it is effective to activate the reactive gas such that a reaction is started (or promoted) even at low temperature. This is because the method of forming a film by introducing the activated reactive gas, i.e., radical gas can keep the reaction temperature on the substrate low.

On the other hand, since radical gas has a property of deactivating when brought into contact with metal, it is necessary to introduce the radical gas into the film-forming chamber through a quartz tube or a high-purity ceramics tube. Further, since radical gas has a high reactivity and reacts in vapor phase when brought into contact with the raw material gas, the radical gas and the raw material gas need to be introduced separately into the film-forming chamber. In addition, in order to ensure uniformity in distribution of thickness, quality, and composition of the film, it is necessary to introduce the raw material gas or a gas mixture of the raw material gas and the reactive gas into the film-forming chamber via a gas head such as a shower head.

However, because shower heads are mainly made of metal, most of the radical gas come into contact with a metal surface when passing through the shower holes, resulting in deactivation. On the other hand, deactivation of the radical gas can be suppressed when the shower head is made of quartz or high-purity ceramics, but in this case, production costs of the shower head are further increased and the shower head thus becomes a very expensive component. Further, as described above, the problem regarding film removability or reusability and the problem regarding conductance are still present. Therefore, a reduction in production costs of semiconductors and an enhancement of productivity may not be expected.

As described above, in thin-film manufacturing apparatuses in the past, there have been problems in that when a radical gas introduction structure for preventing deactivation is given priority, concentration distribution of the raw material gas deteriorates to lose in-plane uniformity, and when the concentration distribution of the raw material gas is given priority, the radical is deactivated.

The present invention has been made in view of the above-mentioned problems, and it is therefore an object of the present invention to provide a gas head and a thin-film manufacturing apparatus, which are low in cost and are capable of suppressing deactivation of radical gas and uniformly introducing a raw material gas on a substrate.

Means for Solving the Problems

To solve the above-mentioned problems, according to the present invention, there is provided a gas head including a first gas introduction port through which a first gas is introduced, a second gas introduction port through which a second gas is introduced, and a dispersion board. The dispersion board is provided opposite to the second gas introduction port and disperses the second gas. The second gas introduction port is provided in a plurality of numbers so as to surround the periphery of the first gas introduction port.

In the gas head of the present invention, although the plurality of second gas introduction ports are disposed around the first gas introduction port, the second gas introduction ports do not need to be minute holes like shower holes. Specifically, in the present invention, the concentration of the second gas is made uniform by the dispersion effect of the dispersion board, thereby enabling a simple structure and repetitive use by washing.

In the gas head of the present invention, there is no need for minute holes like shower holes. Accordingly, it becomes possible to reduce processing costs of the gas head and to completely remove a film adhered to the holes. Furthermore, since the reduction in conductance has a small effect, the discharging time in the film-forming chamber may be reduced. Further, the film-forming temperature can be lowered because the gas head of the present invention can suppress the deactivation of radical gas even when the radical gas is used as a reactive gas. It should be noted that the constituent material of the gas head may be metal, or may be quartz or high-purity ceramics.

The gas head of the present invention is structured such that the gas head includes a base member having a first gas introduction port formed in the center portion thereof and a plurality of second gas introduction ports surrounding the first gas introduction port, and a dispersion board having the opening described above, which is disposed apart from and opposite to the base member and shields the plurality of second gas introduction ports.

In the case where a radical gas is used as a reactive gas, it is preferable that a radical source is disposed on an upstream side of the gas head so that the reactive gas can be excited before the reactive gas is introduced into the film-forming chamber. A catalytic wire heated to high temperature, a microwave generation source, or a plasma generation source is employed as the radical source.

In order to uniformly disperse the second gas, it is preferable that the second gas introduction ports are disposed at equal distances with respect to the first gas introduction port, or the second gas introduction ports are disposed around the first gas introduction port at equiangular intervals. It should be noted that the dispersion board disposed opposite to the second gas introduction ports needs to be positioned apart from the second gas introduction ports by an appropriate interval.

Preferably, the distance (L) between a region of the dispersion board opposite to the second gas introduction ports and the periphery of the opening of the dispersion board is at least 50 mm. It should be noted that the ratio (G/L) of the gap (G) between the base member and the dispersion board to the distance (L) is equal to or smaller than 0.04.

The opening diameter of the second gas introduction ports is not specifically limited, and the second gas introduction ports are formed to have an opening diameter smaller than the opening diameter of the first gas introduction port, for example. Although the number of second gas introduction ports is also not specifically limited as long as it is at least two, the larger the number of second gas introduction ports, the higher the uniformity of the concentration of the second gas.

It should be noted that the distance (S) between the stage and the dispersion board is equal to or smaller than 40 mm. In this case, it is preferable that the area of the opening of the dispersion board is 0.25 times or more than the area of the substrate to be treated, which is loaded on the stage.

Effect of the Invention

As described above, according to the present invention, dispersion uniformity of the gas concentration can be achieved without the plurality of minute holes such as the shower holes. With this structure, it is possible to reduce costs of the gas head and realize repetitive use of the gas head by washing and enhancement in conductance, thereby obtaining reduction in production costs of semiconductor devices and improvement in productivity. Furthermore, since the deactivation of radicals can be suppressed when a radical gas is used as a reactive gas, it is possible to lower the film-forming temperature to thereby ensure reliability of the device and suppress deterioration during processing.

BRIEF DESCRIPTION OF THE DRAWINGS

FIG. 5 are views showing one structure of a gas head according to the present invention, in which

FIG. 6 are views showing another structural example of the gas head according to the present invention, in which

| | Description of Symbols |
|---|---|
| 10 | thin-film manufacturing apparatus |
| 11 | film-forming chamber |
| 12 | vacuum chamber |
| 13 | gas head |
| 14 | stage |
| 21 | reactive gas supply line |
| 22 | raw material gas supply line |
| 23 | radical source |
| 24 | bypass piping |
| 25 | vacuum evacuation line |
| 26 | vacuum evacuation apparatus |
| 30A | reactive gas introduction port |
| 30B | raw material gas introduction port |
| 31 | base member |
| 32 | dispersion board |
| 33 | spacer |
| 34 | opening |
| D | diameter of opening |
| d | diameter of reactive gas introduction port |
| G | interval between base member and dispersion board |
| L | shielding distance |
| S | distance between dispersion board and stage |
| W | substrate |

BEST MODE FOR CARRYING OUT THE INVENTION

Hereinafter, an embodiment of the present invention will be described with reference to the accompanying drawings.

Figure 1:
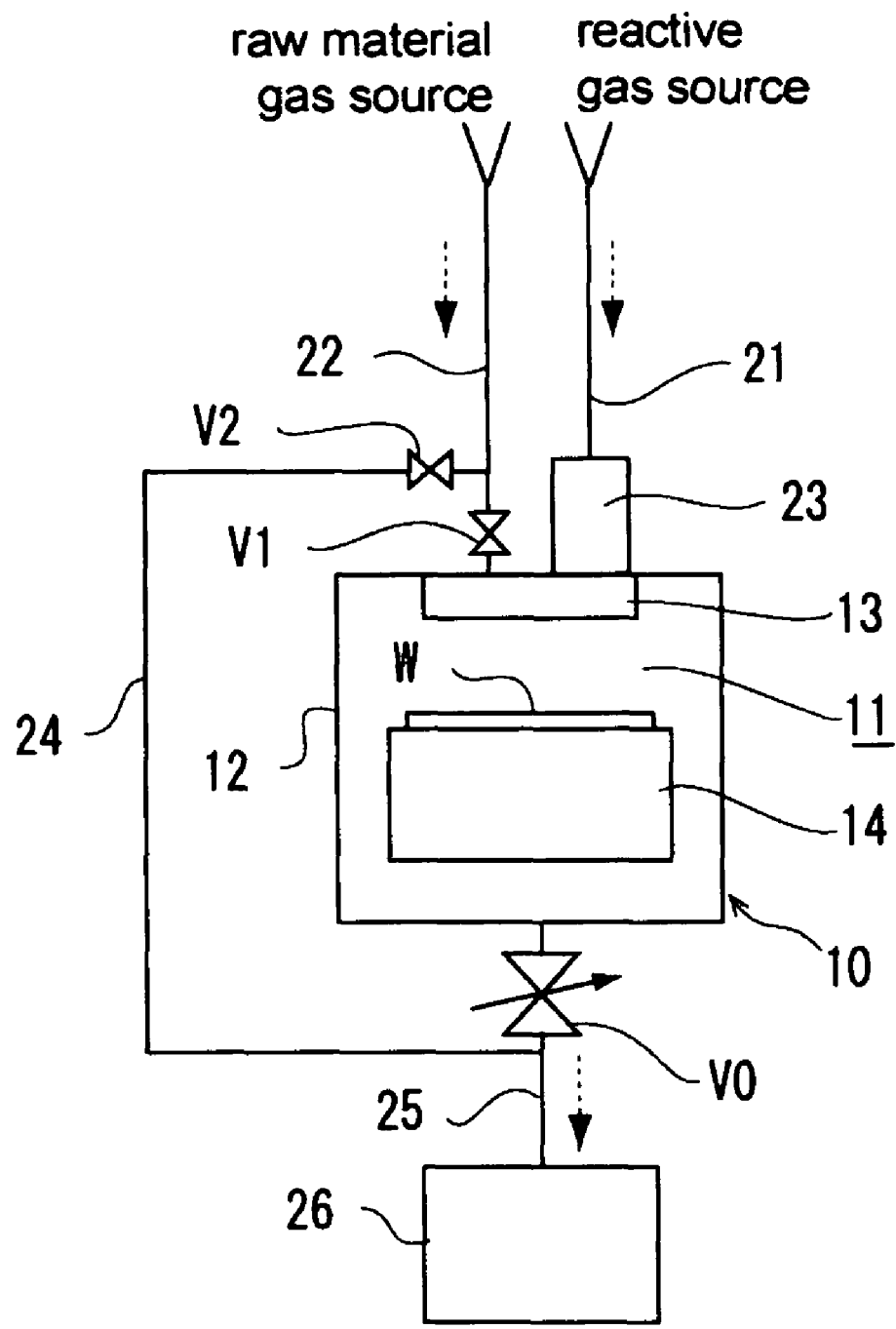
FIG. 1 is a structural schematic diagram of a the piping of a thin-film manufacturing apparatus according to an embodiment of the present invention.

FIG. 1 is a structural diagram of a piping of the film-forming gas supply line and a vacuum evacuation line of a thin-film manufacturing apparatus 10 according to an embodiment of the present invention. It should be noted that the term "film-forming gas" used in the present specification refers to a single gas such as a raw material gas, a reactive gas, and an inert gas used for a chemical reaction, or a gas mixture of those.

The thin-film manufacturing apparatus 10 includes a vacuum chamber 12 having a film-forming chamber (reaction chamber) 11 formed therein, a gas head 13 for introducing the raw material gas and the reactive gas into the film-forming chamber 11, and a stage 14 disposed in the film-forming chamber 11. The stage 14 supports a substrate to be treated (hereinafter, referred to as "substrate") W such as a semiconductor wafer or a glass substrate.

The film-forming chamber 11 is connected to a vacuum evacuation apparatus 26 via a vacuum evacuation line 25, and configured to be capable of evacuating to a predetermined reduced-pressure atmosphere by opening a main valve V0. The stage 14 is disposed opposite to the gas head 13. The stage 14 is composed of a hot plate, for example, and is configured to be capable of heating the substrate W loaded on the stage 14 to a predetermined temperature.

The gas head 13, as described in detail below, is connected to a reactive gas supply line 21 in communication with a reactive gas source and a raw material gas supply line 22 in communication with a raw material gas source, to thereby introduce the raw material gas and the reactive gas, or the gas mixture thereof into the film-forming chamber 11. In particular, the gas head 13 has a function of uniformly introducing the raw material gas within the plane of the substrate W on the stage 14.

The reactive gas corresponds to the "first gas" of the present invention, and the raw material gas corresponds to the "second gas" of the present invention. It should be noted that an inert gas may be used as the first gas instead of, or in combination with the reactive gas, as described below. NH3 (ammonia gas), H2 (hydrogen gas) or the like is used as the reactive gas. Organometallic materials of film-forming metals (Ta, Cu, Al, Ti, Zr, V, Nb) are used as the raw material gas and are selected in accordance with a film to be formed (wiring film, barrier film, or the like). In this case, a nitride film of those metals is prepared using a nitrogen gas such as an activated ammonia gas as the reactive gas. N2 or Ar is used as the inert gas.

Figure 2:
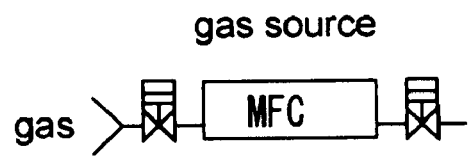
FIG. 2 is a schematic diagram showing an example of an arrangement of a reactive gas source.
Figure 3:
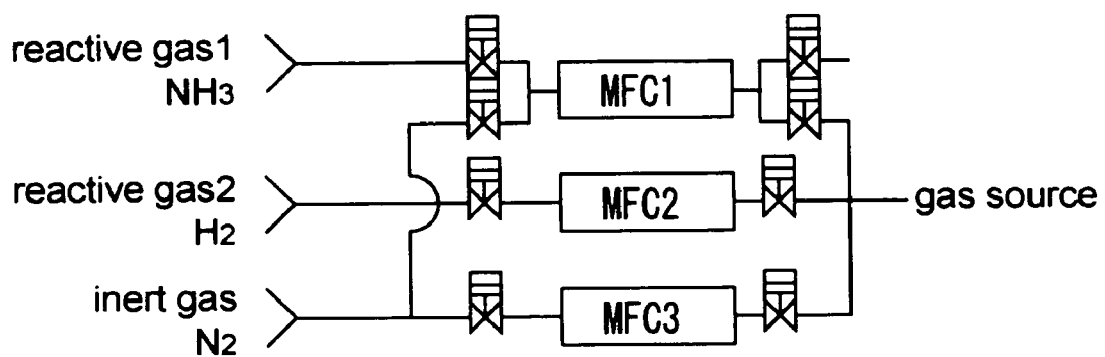
FIG. 3 is a schematic diagram showing another example of an arrangement of a reactive gas source.

Now, a description will be given of the reactive gas source. The reactive gas source is a common gas source (reactive gas source, inert gas source, or the like) capable of controlling the gas flow rate using a mass flow controller (MFC), as shown in FIG. 2. By integrating a plurality of the gas sources, it becomes possible to discharge a plurality of gases from a single gas source. FIG. 3 shows an example of the integrated gas sources. In the example shown in the figure, the reactive gas 1 is NH3, the reactive gas 2 is H2, and the inert gas is N2. A single gas or a gas mixture may be used as the gas source.

A system that gasifies a solid or liquid organometallic raw material into a raw material gas is used as the raw material gas source. In the case where a liquid raw material is used, a vaporization system or a bubbling system that delivers the liquid to a vaporizer to vaporize the liquid is used. In the case where a solid raw material is used, a composite system including a raw material heating system and a vaporization system, which liquefies the solid by heat before vaporizing it with a vaporizer, a composite system including a heating system and a bubbling system, a sublimation system that gasifies the solid raw material, or the like is used. It should be noted that the raw material gas may be a gas commonly used in production processes of semiconductors such as WF6 instead of organometallic materials.

The reactive gas and the raw material gas introduced into the film-forming chamber 11 mutually cause chemical reaction to form a metal thin-film on the substrate W. A by-product and redundant gas are discharged via the vacuum evacuation line 25.

The reactive gas and the raw material gas may be introduced simultaneously or separately into the film-forming chamber 11. The raw material gas supply line 21 makes a switch between introduction and non-introduction of the raw material gas by opening and closing a first valve V1. It should be noted that the thin-film manufacturing apparatus 10 is also configured to be capable of discharging the raw material gas via bypass piping 24 without passing through the film-forming chamber 11, by opening a second valve V2 when the first valve V1 is closed. In this case, the second valve V2 is closed during the film-formation and is opened after the film-formation is completed. By supplying the raw material gas in this way, it becomes possible to stably introduce the raw material gas into the film-forming chamber 11.

In addition, it is also possible to activate the reactive gas before introduction thereof into the film-forming chamber 11. In this embodiment, a radical source 23 that excites the reactive gas supplied via the reactive gas supply line 21 to generate radicals is provided in the vicinity of the gas head 13. A catalytic wire heated to high temperature is used as the radical source 23, for example.

Figure 4:
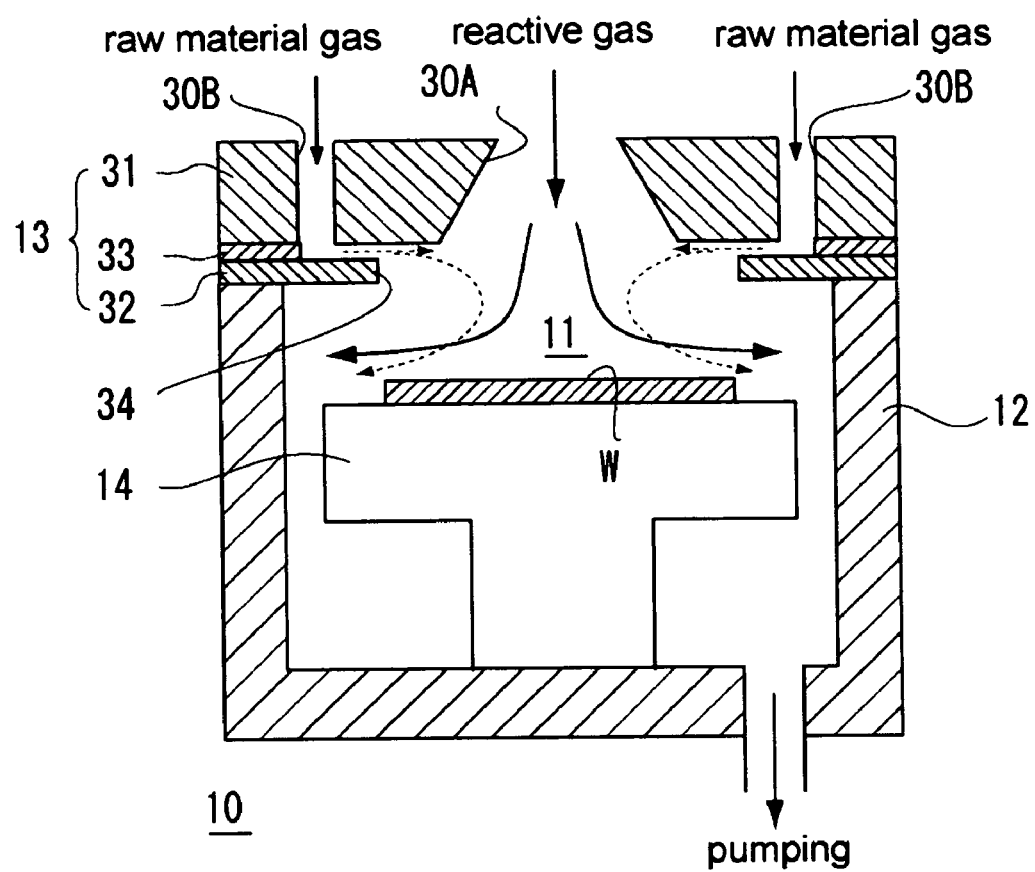
FIG. 4 is a schematic cross sectional view of a thin-film manufacturing apparatus.
Figures 5A, 5B, 5C:
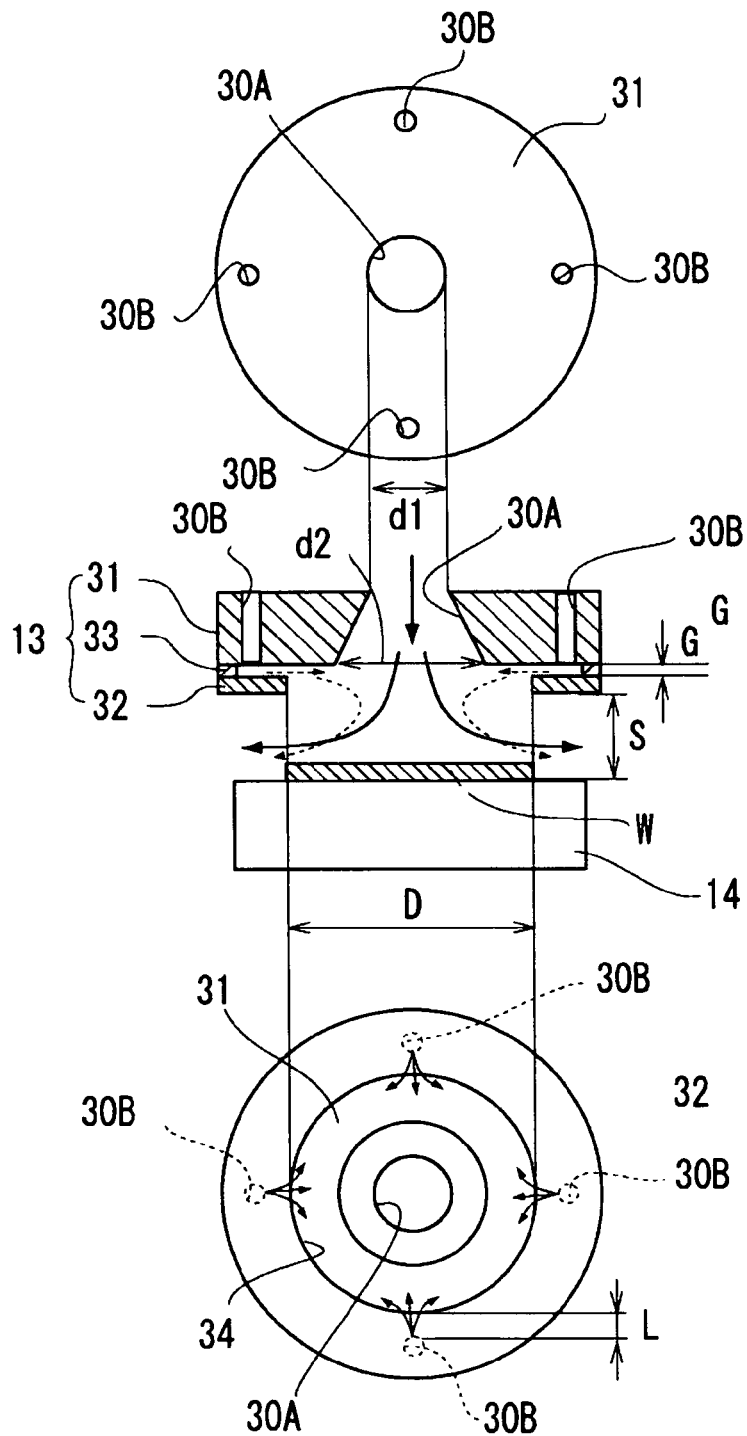
FIG. 5A is a plan view thereof.
FIG. 5B is a side cross sectional view thereof.
FIG. 5C is a bottom view thereof.

Next, the gas head 13 has a function of supplying the raw material gas onto the surface of the substrate W at uniform concentration, thereby ensuring in-plane uniformity in thickness, quality, and composition of a thin-film formed on the substrate W. Hereinafter, a description will be given of details of the gas head 13. FIG. 4 is a schematic structural diagram of the thin-film manufacturing apparatus 10. FIG. 5A is a plan view of the gas head 13, FIG. 5B is a cross-sectional side view thereof, and FIG. 5C is a bottom view thereof.

The gas head 13 is composed of an assembly including a base member 31, a dispersion board 32, and a spacer 33, and disposed in an upper portion of the vacuum chamber 12. The base member 31 and the dispersion board 32 are assembled to be detachable from each other via clamping means (not shown) such as a bolt provided between the base member 31 and the dispersion board 32 in an outermost circumference thereof. It should be noted that a sealing member may be provided between the base member 31 and the dispersion board 32, as necessary.

The base member 31, the dispersion board 32, and the spacer 33 constituting the gas head 13 may be made of metal such as aluminum or stainless steel, but they may also be made of quartz, high-purity ceramics, or the like. The material used for the base member 31, the dispersion board 32, and the spacer 33 may be appropriately selected depending on the type of the gas used.

A reactive gas introduction port (a first gas introduction port) 30A through which the reactive gas is introduced is provided in a center portion of the base member 31. Raw material gas introduction ports 30B through which the raw material gas is introduced are provided around the reactive gas introduction port 30A. The reactive gas introduction port 30A is located in a center portion of the substrate W on the stage 14. As shown in FIG. 5A, a plurality of (in this embodiment, four) raw material gas introduction ports 30B are disposed so as to surround the periphery of the reactive gas introduction port 30A.

Although the opening diameter of the raw material gas introduction ports 30B is not specifically limited, in this embodiment, the raw material gas introduction ports 30B are formed with a diameter smaller than that of the reactive gas introduction port 30A and formed to be circular holes, each having the same (for example, 15 mm) diameter. The raw material gas introduction ports 30B are disposed at equal distances with respect to the reactive gas introduction port 30A. In addition, the raw material gas introduction ports 30B are disposed around the raw material gas introduction port 30A at equiangular intervals.

The dispersion board 32 is opposed to the lower surface of the base member 31 so as to shield the raw material gas introduction ports 30B. An interval between the dispersion board 32 and the base member 31 (raw material gas introduction ports 30B) is adjusted by the thickness of the spacer 33. The spacer 33 may be composed of a single component, or may be formed integrally with the periphery of the lower surface of the base member 31 or the periphery of the upper surface of the dispersion board 32.

An opening 34 is provided in a center portion of the dispersion board 32 in a region opposite to the reactive gas introduction port 30A. The shape of the opening 34 is arbitrary, but in this embodiment, the opening 34 is a circular hole that has a diameter larger than the opening diameter of the reactive gas introduction port 30A (FIG. 5C). It should be noted that the reactive gas introduction port 30A has a conical trapezoid shape with an opening diameter that becomes larger toward the dispersion board 32 side (d1<d2), but the shape thereof is not limited thereto. The reactive gas introduction port 30A may have a vertical cylindrical shape in which the opening diameter (d) is unchanged.

The area (or the diameter D) of the opening 34 of the dispersion board 32 may be set according to the area of the substrate W to be loaded on the stage 14. In this embodiment, the area of the opening 34 is set to be 0.25 times or more than the area of the substrate W. In this case, the distance S between the stage 14 and the dispersion board 32 is 40 mm or less.

As shown in FIG. 5C, if the distance L between the region on the dispersion board 32 opposite to the raw material gas introduction ports 30B and the periphery of the opening 34 (hereinafter, referred to as shielding distance) is too small, the dispersion direction of the raw material gas is fixed, resulting in deteriorated dispersion. Thus, in this embodiment, the shielding distance L is at least 50 mm.

Further, if the interval G (FIG. 5B) between the dispersion board 32 and the base member 31 is smaller than necessary, the flow rate of the raw material gas becomes too high, resulting in deteriorated dispersion. Thus, in this embodiment, the thickness G of the spacer 33 is also adjusted according to the length of the shielding distance L, and in this embodiment, G/L is set to be equal to or larger than 0.04. Therefore, if L=50 mm, G is equal to or larger than 2 mm.

Figures 6A, 6B, 6C:
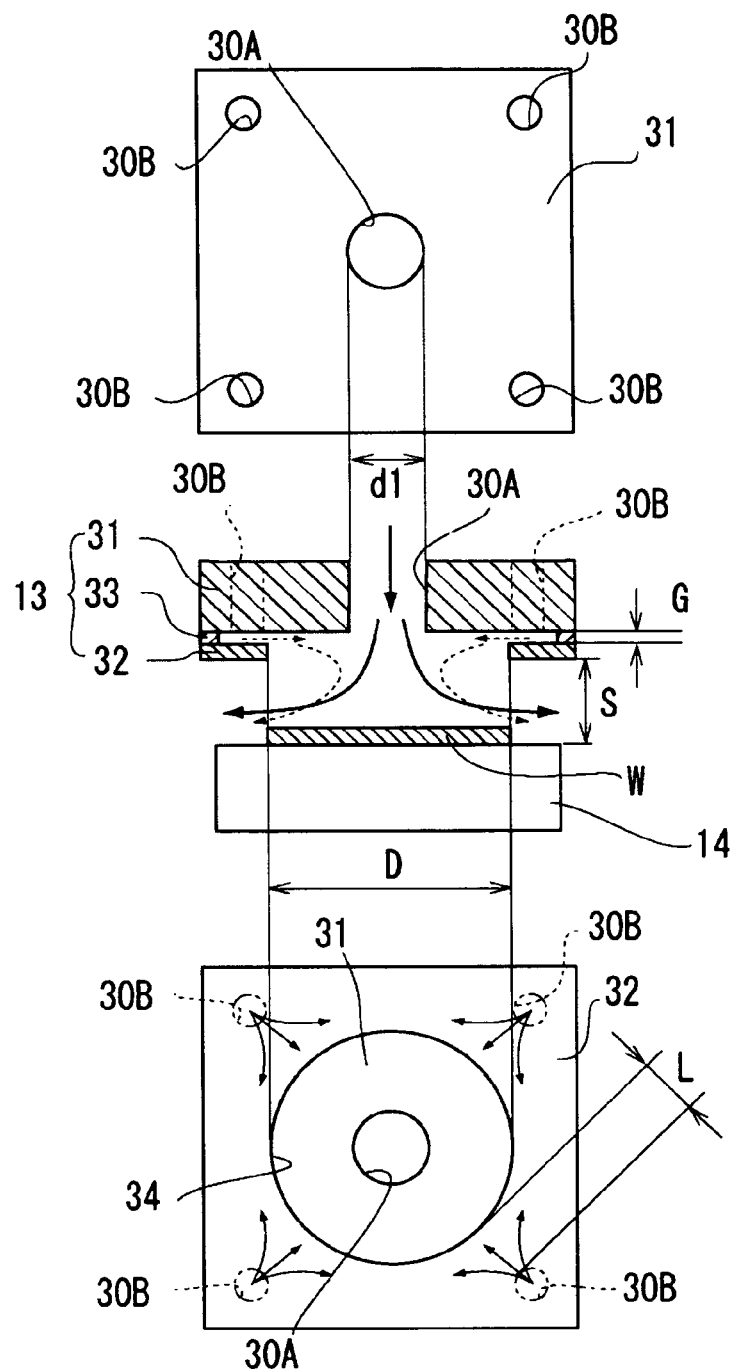
FIG. 6A is a plan view thereof.
FIG. 6B is a side cross sectional view thereof.
FIG. 6C is a bottom view thereof.

It should be noted that the base member 31 and the dispersion board 32 of the gas head 13 are not limited to the circular shape in the plan view as shown in FIG. 5. The base member 31 and the dispersion board 32 of the gas head 13 may be of a rectangular shape such as a square shape in the plan view as shown in FIG. 6. In the example shown in FIG. 6, each of the raw material gas introduction ports 30B is formed at the corners of the base member 31, respectively. It should be noted that, in FIG. 6, portions corresponding to those of FIG. 5 are denoted by the same reference symbols.

Next, a description will be given of an operation of the thin-film manufacturing apparatus 10 and the gas head 13 of this embodiment structured as described above.

The reactive gas (or radical gas, inert gas) led into the reactive gas introduction port 30A passes through the opening 34 of the dispersion board 33 to be supplied onto the surface of the substrate W on the stage 14 disposed immediately below the dispersion board 32. On the other hand, the raw material gas is led into the plurality of raw material gas introduction ports 30B simultaneously and dispersed by the dispersion board 32. The dispersed raw material gas is supplied to the surface of the substrate W through the opening 34 of the dispersion board 32, along an exhaust gas flow formed around the stage 14.

In the gas head 13 of this embodiment, the raw material gas is introduced in an amount uniform across the entire surface of the substrate W by disposing the raw material gas introduction ports 30B at a plurality of positions, dispersing the raw material gas introduced from each of the gas introduction ports, and gathering the dispersed gas at a position where the opening 34 is formed. Accordingly, it is possible to ensure in-plane uniformity in thickness, quality, and composition of a thin-film to be formed on the substrate W.

The raw material gas and the reactive gas may be introduced simultaneously, or may be introduced separately into the film-forming chamber 11. In addition, the reactive gas may be excited by the radical source 23 and introduced into the film-forming chamber 11 as an activated radical gas. Further, an inert gas may be introduced instead of, or in combination with the reactive gas. In other words, the mode of introduction of those film-forming gases can be changed depending on the type of the film-forming process.

Figure 7A:
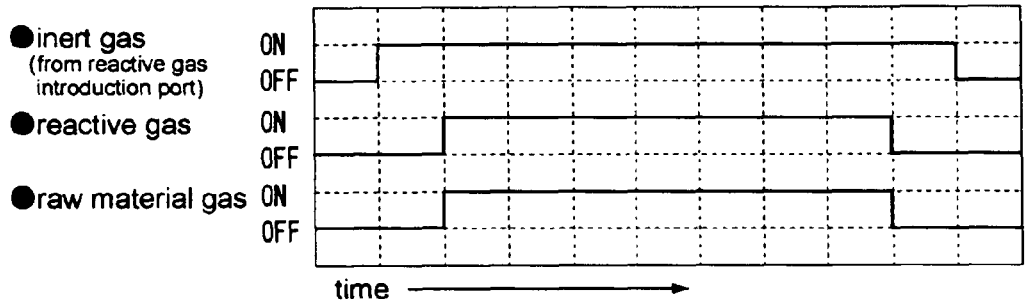
FIGS. 7A to 7C are timing charts, each showing an example of a film-forming gas introduction mode.

For example, in a typical CVD (MOCVD) method, the reactive gas and the raw material gas are introduced simultaneously to the gas head 13 to form a film on the substrate W. An example of the introduction in this case is shown in FIG. 7A. An inert gas is used as a carrier gas for the reactive gas. The reactive gas and the raw material gas are mixed in a reaction space between the opening 34 of the gas head 13 and the stage 14. Contact between the raw material gas and the reactive gas causes a chemical reaction, and products of the reaction are deposited on the substrate W to form a predetermined metal film. In particular, a metal nitride film can be formed by using a gas including nitrogen, such as ammonia gas, as the reactive gas. A by-product generated by the reaction or residual film-forming gas is discharged outside the film-forming chamber 11 via the periphery of the stage.

According to this embodiment, the raw material gas can be uniformly introduced to the surface of the substrate by the gas head 13. Thus, in-plane uniformity in thickness, quality, and composition of the metal film to be produced can be stably obtained. Further, the gas head 13 itself has a simple structure with no minute holes such as shower holes. Thus, the gas head 13 can be easily disassembled and washed for repetitive use. This enables reduction in costs for usage of gas heads.

Furthermore, in the gas head 13 of this embodiment, it is possible to prevent the reactive gas and the raw material gas from reacting before introduction, because the gases are introduced separately into the film-forming chamber 11. Thus, it is possible to enhance the cleanliness in the gas supply lines and to achieve a stable supply of gases and prolonged maintenance cycles.

The reactive gas can be activated by the radical source 23 and introduced into the film-forming chamber 11 as a radical gas. Accordingly, the film-forming temperature of the substrate W can be lowered, the reliability of the device can be ensured, and deterioration of the substrate W during processing can be suppressed. Particularly in the gas head 13 according to this embodiment, minute holes like shower holes are not employed as gas introduction paths. Thus, deactivation of radicals can be suppressed and the low film-forming temperature of the substrate can be maintained.

Meanwhile, the reactive gas and the raw material gas are alternately introduced into the film-forming chamber 11. Such a mode of film-forming gas introduction can be used suitably in an ALD (Atomic Layer Deposition) film-forming process. An ALD film-forming method is a film-forming process of repeating a process in which one of a reactive gas (radical gas) and a raw material gas is introduced into a film-forming chamber to be discharged thereafter, and the other gas is then introduced into the film-forming chamber to be discharged thereafter a number of times, to thereby deposit metal thin-films onto a substrate W in units of several atomic layers (refer to Patent Document 2 above).

An inert gas is often used as an assist gas to discharge the introduced gas. The assist gas has a function of readily forcing the reactive gas or the raw material gas out of the film-forming chamber 11, and a function of suppressing a pressure change in the film-forming chamber 11 to a minimum level to thereby suppress a change in temperature on the substrate.

Figure 7B:
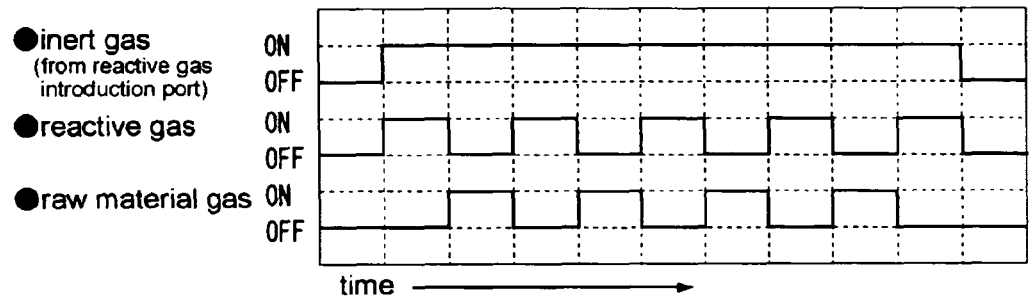
Figure 7C:
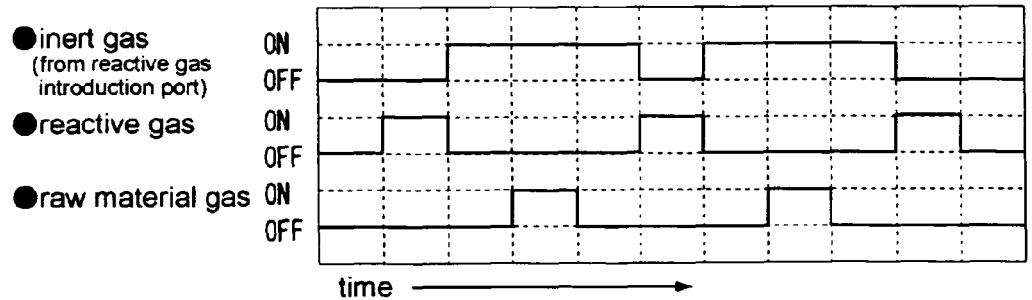

Examples of timing of gas introduction in the ALD process as described above are shown in FIGS. 7B and 7C. The example illustrated in FIG. 7B shows a case where the inert gas is introduced simultaneously with the reactive gas and the raw material gas. The example illustrated in FIG. 7C shows a case where introduction of the inert gas is stopped at the time of introduction of the reactive gas. These timings of gas introduction are mere examples, and optimal introduction flows may be employed for each process.

In this embodiment, no minute holes such as shower holes are used as gas introduction paths for the gas head 13. Thus, the gases can be readily discharged via the gas head 13, and gas refill time in the ALD process as described above can be reduced, resulting in improved productivity.

Example

Hereinafter, a description will be given of an example of the present invention, however the present invention is not limited to the following example.

The gas head 13 described with reference to FIG. 5 is produced and incorporated into the vacuum chamber. The opening diameter of the reactive gas introduction port 30A was 100 mm (d1=d2). The opening diameter of the raw material gas introduction ports 30B was 15 mm. The interval G between each of the raw material gas introduction ports 30B and the dispersion board 32 was 2 mm. The diameter D of the opening 34 of the dispersion board 32 was 240 mm. The shielding distance L of the dispersion board 32 was 50 mm. The distance S between the stage 14 and the dispersion board 32 was 35 mm.

Film-forming gases were introduced to produce a TaN film. Film-forming conditions such as the type of film-forming gases and the flow rate of the film-forming gases were as follows:

| Raw material gas: PEMAT: $Ta[N(CH_3)(C_2H_6)]_5$ | 0.7 mg/min |
|---|---|
| N2 (carrier gas) | 500 sccm |
| Reactive gas: NH3 | 200 sccm |
| Partial pressure regulation/ Assist gas: Ar | 460 sccm |
| Film-forming pressure: | constantly adjusted to 1 Torr by a pressure-regulating valve |
| Substrate temperature: | 318° C. |

To use liquid PEMAT at room temperature, a vaporization system was used as a raw material gas source. A gas mixture of N2 (N2 assists in atomization of PEMAT and works as a carrier) and vaporized PEMAT (=raw material gas) is prepared in a vaporizer.

Further, NH3 was introduced into the radical source 23 from the reactive gas source, and the NH3-atoms were introduced into the film-forming chamber 11 as an activated radical gas. Film-formation was performed by introducing the film-forming gases into the film-forming chamber 11 while the substrate W was loaded on the stage 14.

The order in which the film-forming gases were introduced was in the stated order of the raw material gas, the assist gas, the radical gas, and the assist gas. This cycle was repeated a plurality of times. A TaN film that has a thickness of 30 nm was formed on the substrate by generating a Ta film by the raw material gas, removing impurities in the Ta film by the radical gas, and azotizing the Ta film to generate the TaN film.

Figure 8:
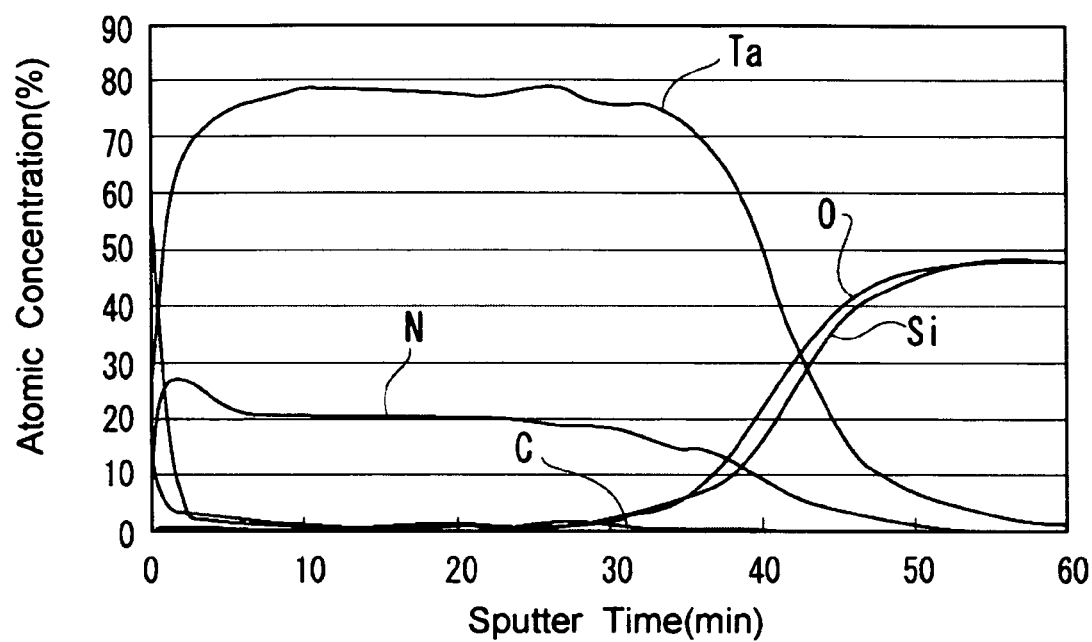
FIG. 8 is a graph showing an Auger electron spectroscopy analysis of a sample film described in an example of the present invention.

FIG. 8 shows an AES (Auger Electron Spectroscopy) analysis result of the prepared TaN film. It can be seen that a film having a constant composition is formed in the film thickness direction, and supply concentration of the raw material gas in the film-forming process is stably maintained.

In addition, deactivation of radicals was suppressed, and a favorable TaN film was prepared even when the substrate temperature was 318° C. In other words, it is appreciated that further reduction in film-forming temperature is realized as compared to the typical MOCVD method that does not use the radical gas, in which a substrate temperature equal to or higher than 400° C. is required.

Figure 9A:
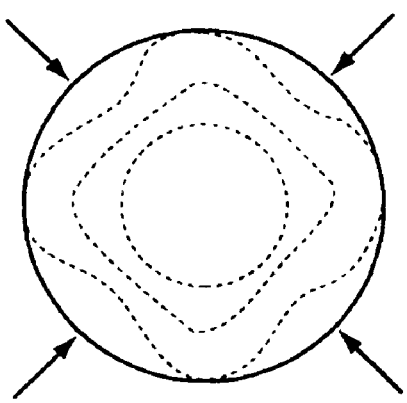
FIG. 9A is a comparative example of an experimental result regarding in-plane distribution of a sample film within a substrate.
Figure 9B:
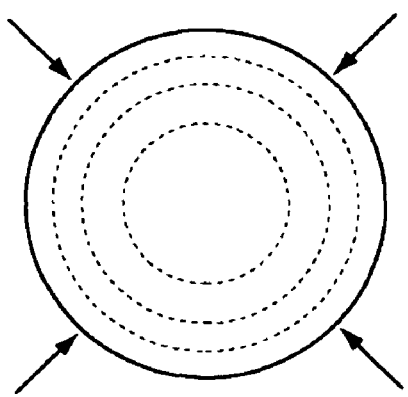
FIG. 9B is an example thereof.
Figure 10:
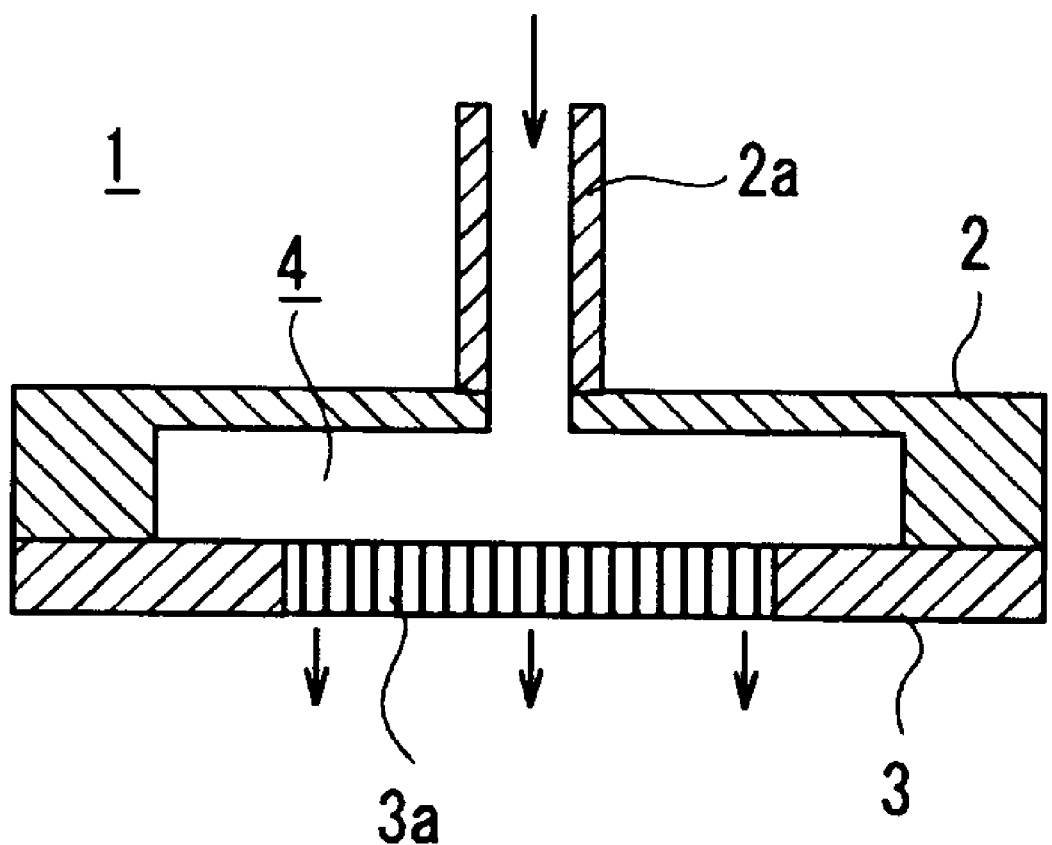
FIG. 10 is a schematic structural diagram of a shower head.

Next, FIG. 9 each show specific resistance (film thickness) distribution of the prepared TaN film on the surface of the substrate. FIG. 9A is a diagram in the case where the shielding distance L of the dispersion board 32 of the gas head 13 is 30 mm. FIG. 9B is a diagram in the case where the shielding distance L is 50 mm. In FIG. 9, dotted lines in each plane correspond to contour lines representing distribution gradient. In addition, arrows in FIG. 9 indicate introduction directions (four directions) of the raw material gas.

As shown in FIG. 9A, in the case of the shielding distance L of 30 mm, in-plane specific resistance distribution significantly varies between the introduction directions and directions other than the introduction directions of the raw material gas. This is because the film thickness in the vicinity of the gas introduction ports greatly affects the specific resistance distribution.

In contrast, as shown in FIG. 9B, in the case of the shielding distance L of 50 mm, the specific resistance distribution is uniform from a circumference portion of the substrate to a center portion thereof irrespective of the introduction directions of the raw material gas. Thus, it can be seen that in-plane uniformity in distribution is improved. The larger the shielding distance L of the dispersion board 32, the higher the in-plane uniformity in distribution. Accordingly, in this example, it can be seen that favorable in-plane uniformity in distribution can be obtained when the shielding distance L is at least 50 mm.

Although the embodiment of the present invention has been described above, the present invention is not limited to the embodiment, and it is of course possible to make various modifications based on the technical idea of the present invention.

For example, in the embodiment described above, a total of four raw material gas introduction ports 30B are provided in the periphery of the reactive gas introduction port 30A. However, the number of gas introduction ports may be increased instead of being limited to this number. Further, the opening of the reactive gas introduction port 30A and the opening of the raw material gas introduction ports 30B may have an ellipsoidal shape, an arc-shape, a rectangular shape, or the like, instead of a circular shape.

In addition, in order to enhance a function of the dispersion board 32 for dispersing the raw material gas, the surface of the region on the dispersion board 32 opposite to the raw material gas introduction ports 30B may be roughened. Further, in order to control the introduction direction of the raw material gas after the gas is dispersed, the periphery of the opening 34 may be formed to have a downward tapered shape, for example.

Furthermore, in the above embodiment, the example in which the gas head 13 according to the present invention is applied to the thin-film manufacturing apparatus 10 has been described. However, the gas head 13 can also be applied to an etching apparatus. In this case, H2 or N2 gas can be introduced into the first gas introduction port corresponding the reactive gas introduction port 30A in the above embodiment, and NF3 gas can be introduced into the second gas introduction ports corresponding to the raw material gas introduction ports 30B.

The invention claimed is:

1. A gas head, comprising:
a base member including a first gas introduction port having a conical trapezoidal shape with increasing diameter towards a substrate surface for the introduction of a first gas formed in a center portion thereof and a plurality of second gas introduction ports for the introduction of a second gas formed around the first gas introduction port; and
a dispersion board having a first portion and a second portion, the first portion supported by a sidewall of the chamber, the second portion extending parallel to the back surface of the base member, the second portion disposed opposite to the plurality of second gas introduction ports and spaced apart from the base member, the dispersion board having an opening in a region opposite to the first gas introduction port, whereby the dispersion board disperses the second gas introduced from the plurality of second gas introduction ports and allows passage of the first gas and the second gas from the opening,
wherein the plurality of second gas introduction ports are disposed at equal distances and at equiangular intervals from the first gas introduction port; and
a spacer interposed between the base member and the dispersion board for spacing therebetween, wherein the gas head is provided with a radical source for exciting the first gas.

2. The gas head according to claim 1, wherein the spacer is formed integrally with any one of the periphery of the lower surface of the base member and the periphery of the upper surface of the dispersion board.

3. A thin-film manufacturing apparatus, comprising:
a film-forming chamber;
evacuating means for evacuating the film-forming chamber;
a stage disposed in the film-forming chamber, for supporting a substrate to be treated; and
a gas head disposed opposite to the stage, for introducing film-forming gases into the film-forming chamber,
wherein the gas head includes:
a base member including a first gas introduction port having a conical trapezoidal shape with increasing diameter towards a substrate surface for introducing a first film-forming gas formed in a center portion thereof and a plurality of second gas introduction ports for introducing a second film-forming gas formed around the first gas introduction port; and
a dispersion board having a first portion and a second portion, the first portion supported by a sidewall of the chamber, the second portion extending parallel to the back surface of the base member, the second portion disposed opposite to the plurality of second gas introduction ports and spaced apart from the base member, the dispersion board having an opening in a region opposite to the first gas introduction port, whereby the dispersion board disperses the second film-forming gas introduced from the plurality of second gas introduction ports and allows passage of the first film-forming gas and the second film-forming gas from the opening, and
wherein the plurality of second gas introduction ports are disposed at equal distances and at equiangular intervals from the first gas introduction port; and
a spacer interposed between the base member and the dispersion board for spacing therebetween, wherein the gas head is provided with a radical source for exciting the first gas.

4. The thin-film manufacturing apparatus according to claim 3, wherein the plurality of second gas introduction ports are disposed at equal distances from the first gas introduction port.

5. The thin-film manufacturing apparatus according to claim 3, wherein the opening of the dispersion board has an area larger than that of the first gas introduction port.

6. The thin-film manufacturing apparatus according to claim 3, wherein the first film-forming gas is a reactive gas or an inert gas, and the second film-forming gas is a raw material gas.

7. The thin-film manufacturing apparatus according to claim 3,
wherein the distance between a region of the dispersion board opposite to the plurality of second gas introduction ports and a periphery of the opening of the dispersion board is at least 50 mm.

8. The thin-film manufacturing apparatus according to claim 3,
wherein the ratio (G/L) of a gap (G) between the base member and the dispersion board to a distance (L) between a region of the dispersion board opposite to the plurality of second gas introduction ports and a periphery of the opening of the dispersion board is equal to or larger than 0.04.

9. The thin-film manufacturing apparatus according to claim 3,
wherein the opening of the dispersion board has an area 0.25 times or more than the area of a substrate to be treated on the stage.

10. The thin-film manufacturing apparatus according to claim 9,
wherein the distance between the stage and the dispersion board is equal to or smaller than 40 mm.

* * * * *